US009158344B2

(12) United States Patent
Pyeon

(10) Patent No.: US 9,158,344 B2
(45) Date of Patent: Oct. 13, 2015

(54) CPU WITH STACKED MEMORY

(71) Applicant: Conversant Intellectual Property Management Inc., Ottawa, CA (US)

(72) Inventor: Hong Beom Pyeon, Ottawa, CA (US)

(73) Assignee: Conversant Intellectual Property Management Inc., Ottawa (CA)

( * ) Notice: Subject to any disclaimer, the term of this patent is extended or adjusted under 35 U.S.C. 154(b) by 85 days.

(21) Appl. No.: 13/689,070

(22) Filed: Nov. 29, 2012

(65) Prior Publication Data

US 2013/0141858 A1    Jun. 6, 2013

Related U.S. Application Data

(60) Provisional application No. 61/565,709, filed on Dec. 1, 2011.

(51) Int. Cl.
*G06F 1/20* (2006.01)
*G06F 1/18* (2006.01)
*H01L 25/18* (2006.01)
*G06F 15/78* (2006.01)
*G11C 11/401* (2006.01)

(52) U.S. Cl.
CPC ........... *G06F 1/18* (2013.01); *G06F 1/203* (2013.01); *G06F 15/78* (2013.01); *G11C 11/401* (2013.01); *H01L 25/18* (2013.01)

(58) Field of Classification Search
CPC ........... G06F 1/18; G06F 1/203; G06F 15/78; H01L 25/18; G11C 11/401
See application file for complete search history.

(56) References Cited

U.S. PATENT DOCUMENTS

| 6,929,976 | B2 * | 8/2005 | Chan et al. ............... 438/106 |
| 8,014,166 | B2 * | 9/2011 | Yazdani .................. 361/790 |
| 2007/0290315 | A1 | 12/2007 | Emma et al. | |
| 2008/0150088 | A1 * | 6/2008 | Reed et al. .............. 257/621 |
| 2013/0120021 | A1 * | 5/2013 | Chi ......................... 326/37 |

FOREIGN PATENT DOCUMENTS

WO    2009055032    4/2009

OTHER PUBLICATIONS

Loh, Gabriel: 3D-Stacked Memory Architecture for Multi-Core Processors Noted on IDS.*
Loh, Gabriel: 3D-Stacked Memory Architecture for Multi-Core Processors Jun. 2008.*

(Continued)

*Primary Examiner* — Timothy Thompson
*Assistant Examiner* — Ahmad D Barnes
(74) *Attorney, Agent, or Firm* — Daniel Hammond

(57) ABSTRACT

A multi-chip package has a substrate with electrical contacts for connection to an external device. A CPU die is disposed on the substrate and is in communication with the substrate. The CPU die has a plurality of processor cores occupying a first area of the CPU die, and an SRAM cache occupying a second area of the CPU die. A DRAM cache is disposed on the CPU die and is in communication with the CPU die. The DRAM cache has a plurality of stacked DRAM die. The plurality of stacked DRAM dies are substantially aligned with the second area of the CPU die, and substantially do not overlap the first area of the CPU die. A multi-chip package having a DRAM cache disposed on the substrate and a CPU die disposed on the DRAM cache is also disclosed.

17 Claims, 9 Drawing Sheets

(56) References Cited

OTHER PUBLICATIONS

Loh, "3D-Stacked Memory Architectures for Multi-Core Processors", Proceedings of 35th Annual International Symposium on Computer Architecture, Jun. 2008, p. 453-464, vol. 36, No. 3, Washington, DC, U.S.

Loh et al., "Processor Design in 3D Die-Stacking Technologies", IEEE Micro, Jun. 2007, p. 31-48, vol. 27 No. 3, IEEE Computer Society.

Kgil et al., "PicoServer: Using 3D Stacking Technology to Enable a Compact Energy Efficient Chip Multiprocessor", ASPLOS XII, Proceedings of the 12th International Conference on Architecture, Oct. 21, 2006, p. 117-128, vol. 41 No. 11.

Li et al., "Design and Management of 3D Chip Multiprocessors Using Network-in-Memory", Proceedings of the 33rd Annual International Symposium on Computer Architecture, May 2006, vol. 34, No. 2, IEEE Computer Society.

Loi et al., "A Thermally-Aware Performance Analysis of Vertically Integrated (3-D) Processor-Memory Hierarchy", Proceedings of the 43rd Annual Design Automation Conference, Jul. 28, 2006, San Francisco, CA.

Madan et al., "Optimizing Communication and Capacity in a 3D Stacked Reconfigurable Cache Hierarchy", IEEE 15th Internal Symposium on High Performance Computer Architecture, Feb. 18, 2009, Raleigh, NC.

Puttaswamy et al, "Implementing Caches in a 3D Technology for High Performance Processors", IEEE International Conference on Computer Design: VLSI in Computer and Processors, Oct. 5, 2005, San Jose, CA.

Woo et al., "Heterogeneous Die Stacking of SRAM Row Cache and 3-D DRAM: An Empirical Design Evaluation", IEEE 54th International Midwest Symposium on Circuits and Systems, Aug. 10, 2011, Seoul, Korea (South).

Woo et al., "An Optimized 3D-Stacked Memory Architecture by Exploiting Excessive, High-Density TSV Bandwidth", IEEE 16th International Symposium on High Performance Computer Architecture, Jan. 14, 2010, Bangalore, India.

* cited by examiner ically integrate the data storage capacity of their devices. Thus, multiple memory devices that might have previously been laid out adjacent to one another in a lateral plane are now vertically stacked one on top of the other in a Z plane relative to the lateral X/Y plane, thereby greatly increasing the memory density per area that the device occupies on the board.

CPU WITH STACKED MEMORY

CROSS-REFERENCE TO RELATED APPLICATION AND CLAIM OF PRIORITY

This application claims the benefit of priority to U.S. Provisional Patent Application No. 61/565,709, filed on Dec. 1, 2011, the contents of which are hereby incorporated herein by reference in their entirety.

FIELD OF THE INVENTION

The invention relates generally to semiconductor devices, and more specifically to a CPU having stacked memory.

BACKGROUND

The emergence of mobile consumer electronics, such as cellular telephones, laptop computers, Personal Digital Assistants (PDAs), and MP3 players, has increased the demand for compact, high performance memory devices. These memory devices are subject to increasingly stringent constraints in terms of the number of data bits that can be provided at defined operating speeds using the smallest possible device. In this context, the term "smallest" generally refers to the lateral area occupied by the memory device in a "lateral" X/Y plane, such as a plane defined by the primary surfaces of a printed circuit board or module board.

As a result of the constraints on the area occupied by the device, microchip designers have begun to vertically integrate the data storage capacity of their devices. Thus, multiple memory devices that might have previously been laid out adjacent to one another in a lateral plane are now vertically stacked one on top of the other in a Z plane relative to the lateral X/Y plane, thereby greatly increasing the memory density per area that the device occupies on the board.

Recent developments in the fabrication of through silicon vias (TSVs) have facilitated the trend towards vertically stacked semiconductor memory devices, by providing more efficient communication between stacked chips and by further reducing the area occupied by the device. Most 3-D stacked technologies have focused on only chip-level integration in the vertical direction. One performance bottleneck results from the speed difference between the increasingly-fast microprocessor and the relatively fixed latency times of the main memory (typically DRAM). In order to mitigate this performance bottleneck, the memory I/O interface has been improved in an attempt to keep pace with ever-accelerating CPU performance. However, another limiting factor is the distance between the CPU and the memory, which contributes to signal distortion and degradation of signal integrity, and increases power consumption by the I/O signal connection. The distance between the CPU and the memory device is limited by the physical dimensions of memory and the CPU if these devices are both mounted next to each other on the same board. This distance can be reduced by stacking memory devices with the CPU. Two common stacking arrangements are memory over CPU (FIG. 1) and CPU over memory (FIG. 2). The arrangement of FIG. 1 has disadvantages in terms of heat dissipation, because the heat from the CPU must be conducted through the DRAM stack to reach the heat sink. However, the arrangement of FIG. 2 requires the CPU to communicate to external devices (via the board) using TSVs through the intervening DRAM stack, thereby increasing the TSV overhead of the DRAM stack and reducing storage capacity accordingly.

The processor cores of the CPU chip consume a lot of power and generate heat during normal operation. It is not atypical for the processor cores of the CPU chip to generate hot spots about 30° C. (about 55° F.) hotter than the cooler portions of the chip such as the area allocated to the level 2 (L2) SRAM cache. This high temperature can adversely affect the performance of adjacent DRAM devices, which are inherently temperature-sensitive, and which themselves consume a significant amount of power during operation. Higher temperatures contribute to degradation of memory performance, require more frequent refresh cycles, and increase power consumption in DRAM devices. The stacked arrangement exacerbates the heat dissipation problem, because multiple heat-generating dies are in close proximity and must share a heat sink. Thermal issues are one limiting factor in the maximum acceptable height of the DRAM stack, thereby limiting the memory capacity available to the CPU, as well as adversely affecting the proper operation of the DRAM chips provided.

One approach to regulating thermal issues is to configure the CPU so that the hot spots are more evenly distributed over the area occupied by the processor cores. However, this increases design complexity and may conflict with optimized logic block placement in the CPU. In addition, this approach is of limited benefit when the CPU and the DRAM are stacked together, because the DRAM is still exposed to the same quantity of heat overall.

Therefore, there is a need to provide a stacked arrangement of a CPU and a DRAM memory wherein the stacked DRAM memory is exposed to reduced thermal effects.

There is also a need to provide a stacked arrangement of a CPU and a DRAM memory having efficient heat dissipation.

SUMMARY

It is an object of the present invention to address one or more of the disadvantages of the prior art.

It is another object of the invention to provide a multi-chip package arrangement having a CPU chip stacked with a plurality of stacked DRAM chips, wherein the DRAM chips are positioned and dimensioned to substantially not overlap the processor cores of the CPU chip.

It is another object of the invention to provide a multi-chip package arrangement having a CPU chip stacked with a plurality of stacked DRAM chips, wherein the DRAM chips are positioned and dimensioned to substantially overlap only a cache portion of the CPU chip.

In one aspect, a multi-chip package comprises a substrate having electrical contacts for connection to an external device. A CPU die is disposed on the substrate and is in communication with the substrate. The CPU die has a plurality of processor cores occupying a first area of the CPU die; and an SRAM cache occupying a second area of the CPU die. A DRAM cache is disposed on the CPU die and is in communication with the CPU die. The DRAM cache comprises a plurality of stacked DRAM dies. The plurality of stacked DRAM dies are substantially aligned with the second area of the CPU die. The plurality of stacked DRAM dies substantially do not overlap the first area of the CPU die.

In a further aspect, a bulk material is disposed on the CPU die and is substantially aligned with the first area of the CPU die.

In a further aspect, the bulk material has a top surface substantially coplanar to a top surface of the plurality of stacked DRAM dies.

In a further aspect, a chip is disposed on the top surface of the bulk material and on the top surface of the plurality of stacked DRAM dies. The chip is in communication with the CPU die.

In a further aspect, the chip and the plurality of DRAM dies are in communication with the CPU die via through-silicon vias (TSVs).

In a further aspect, at least some of the TSVs pass through the bulk material.

In a further aspect, a heat sink is disposed on a top surface of the plurality of stacked DRAM dies.

In a further aspect, a heat sink is disposed on a top surface of the first area of the CPU die.

In a further aspect, a heat sink is disposed on a top surface of the bulk material.

In a further aspect, a heat sink is disposed on the top surface of the bulk material and on the top surface of the plurality of stacked DRAM dies.

In a further aspect, at least one die is disposed on the CPU die and is substantially aligned with the first area of the CPU die. The at least one die comprises at least one additional processor core.

In an additional aspect, a multi-chip package comprises a substrate having electrical contacts for connection to an external device. A DRAM cache is disposed on the substrate and is in communication with the CPU die. The DRAM cache comprises a plurality of stacked DRAM dies. A bulk material is disposed on the substrate. A CPU die is disposed on the DRAM cache and the substrate. The CPU die is in communication with the substrate. The CPU die comprises a plurality of processor cores occupying a first area of the CPU die; and an SRAM cache occupying a second area of the CPU die. The plurality of stacked DRAM dies are substantially aligned with the second area of the CPU die. The bulk material is substantially aligned with the first area of the CPU die.

In a further aspect, the bulk material has a top surface substantially coplanar to a top surface of the plurality of stacked DRAM dies.

In a further aspect, the substrate and the plurality of DRAM dies are in communication with the CPU die via through-silicon vias (TSVs).

In a further aspect, at least some of the TSVs pass through the bulk material.

In a further aspect, a heat sink is disposed on a top surface of the CPU die.

In a further aspect, at least one die is disposed on a top surface of the bulk material and is substantially aligned with the first area of the CPU die. The at least one die comprises at least one additional processor core.

Additional and/or alternative features, aspects, and advantages of embodiments of the present invention will become apparent from the following description, the accompanying drawings, and the appended claims.

DETAILED DESCRIPTION

Figure 1:
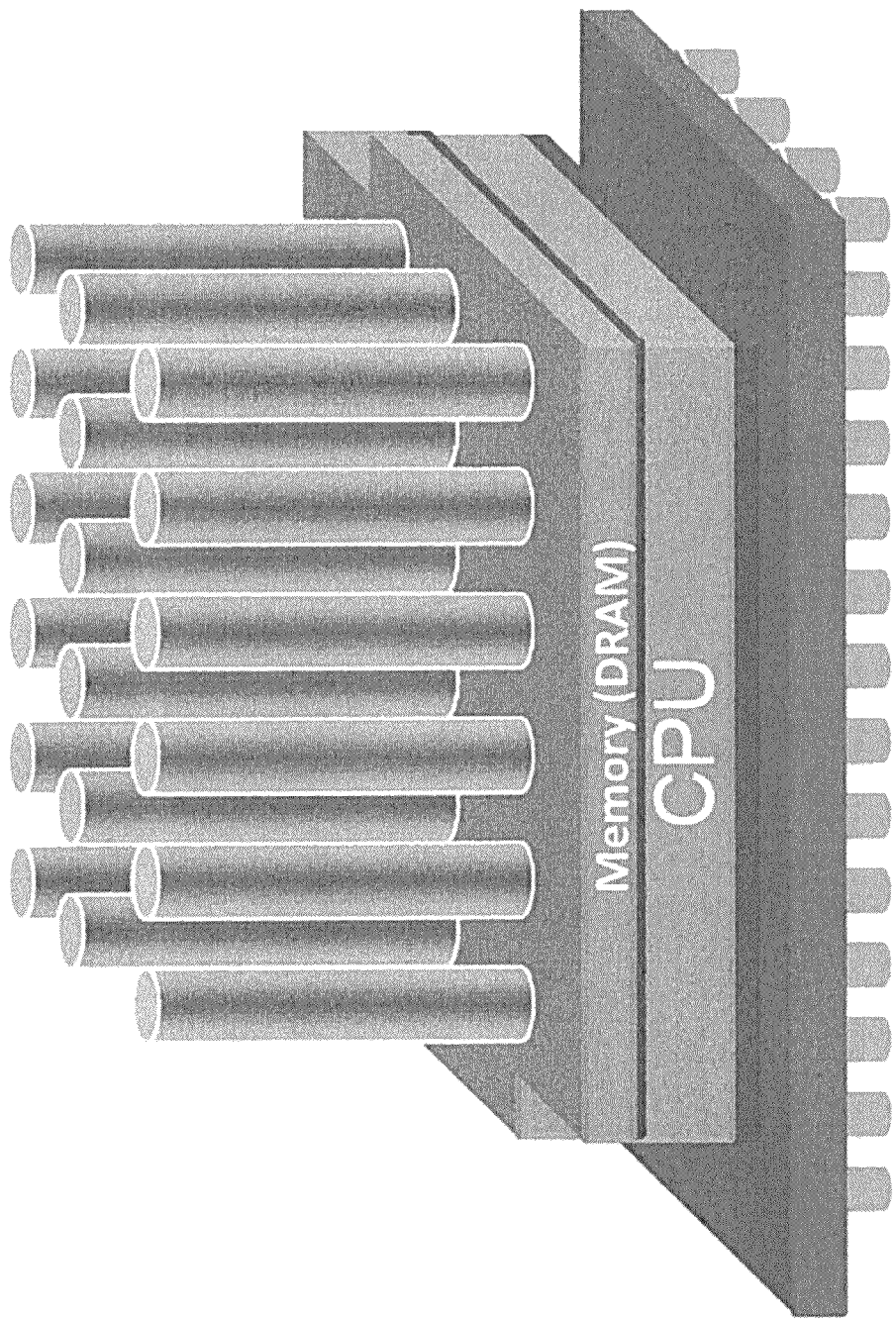
FIG. 1 is a schematic diagram of a memory-over-CPU stacking arrangement according to a prior art embodiment.

Referring generally to FIGS. 3-6, a multi-chip package (MCP) 100 will be described according to a first embodiment. A CPU chip 102 is mounted on a substrate 104 which connects to external devices (not shown) via a ball grid array 106. It is contemplated that the substrate 104 may alternatively be electrically connectable to external devices using any other suitable form of electrical contacts, such as pins. The CPU chip 102 includes a processor region 108 containing two core processors 110, each with its respective level 1 (L1) cache 112. It is contemplated that the CPU chip 102 may alternatively have a single core processor 110 or more than two core processors 110. The CPU chip 102 also includes a non-core region 114 used as a cache region and containing, among other things, a level 2 (L2) SRAM cache 116 and associated circuitry. It is contemplated that other known types of memory may alternatively be used for the L2 cache 116, or that the non-core region may alternatively contain other logic circuitry used in support of the core processors 110. Each of the processor region 108 and the non-core region 114 may take up approximately half of the area of the CPU chip 102; however, it should be understood that the proportions of either may vary according to the desired performance characteristics of the CPU chip 102. A number of DRAM chips 118 are stacked on the top surface 120 of the CPU chip 102, using any suitable known method for adhering each DRAM chip 118 to adjacent chips. While three or four DRAM chips 118 are shown in various embodiments, it should be understood that any number of DRAM chips 118 may be stacked as needed to achieve the desired storage capacity for a particular MCP 100. The DRAM chips 118 are approximately the size of the non-core region 114 of the CPU chip 102, and are stacked on the non-core region 114 of the CPU chip 102 such that when the DRAM chips 118 are stacked they substantially overlap only the non-core region 114 and substantially do not overlap the processor region 108. As a result, the bottom DRAM chip 118 is in contact only with the relatively cooler non-core region 114 of the CPU chip 102 and not the relatively hotter processor region 108 of the CPU chip 102. In this arrangement, less heat is conducted from the CPU chip 102 to the stack of DRAM chips 118, resulting in reduced temperature and improved performance of the DRAM chips 118, and the ability to stack a greater number of DRAM chips 118 before thermal effects on performance become unacceptable. If increased processor capacity is desired, a die 128 having one or more additional core processors 110 may be stacked on top of the processor region 108 of the CPU chip 102. Stacking at least one die 128 containing additional processors 110 on top of the processor region 108 of the CPU chip 102 may enable the non-core region 114 to occupy a higher proportion of the area of the CPU chip 102, thereby enabling larger DRAM chips 118 to be stacked on the CPU chip 102 without overlapping the processor region 108.

Figure 4:
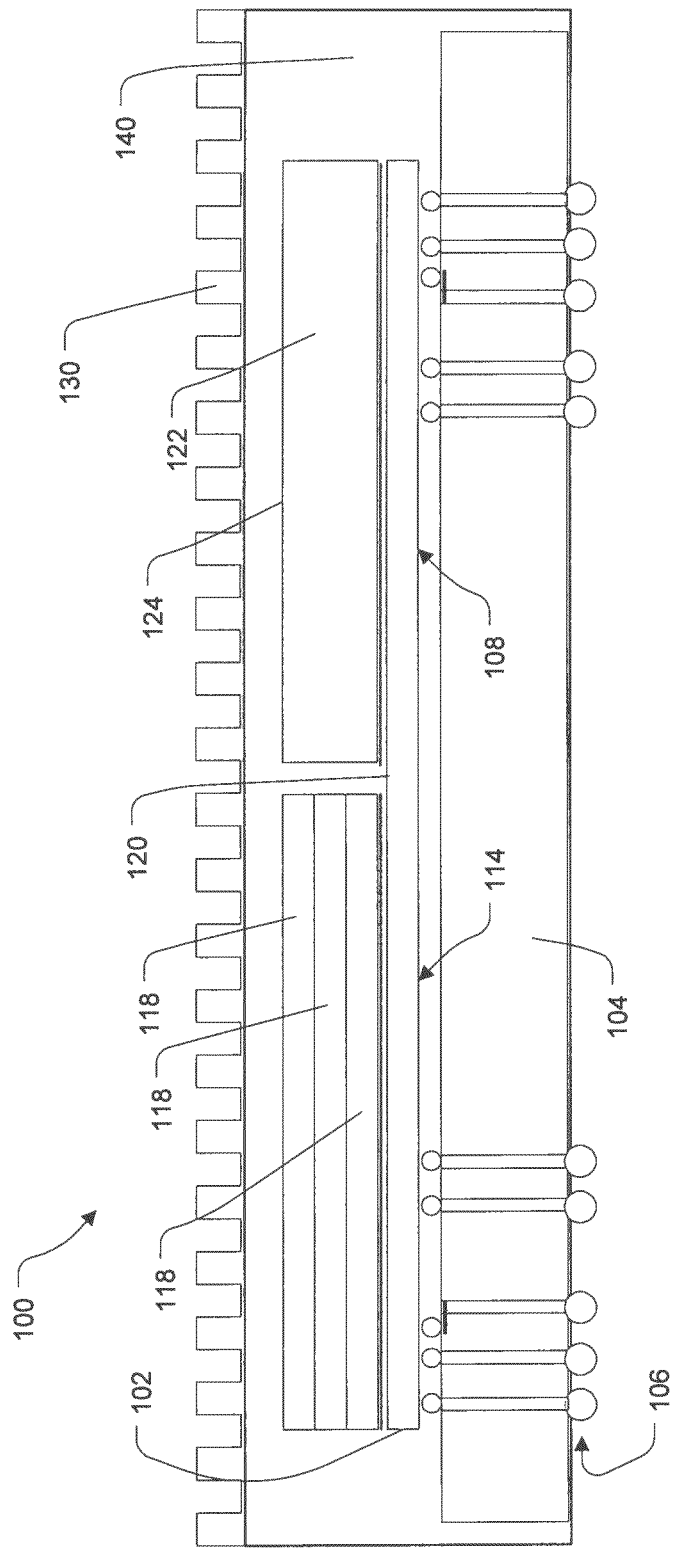
FIG. 4 is a schematic side elevation view of a memory-over-CPU stacking arrangement according to a first embodiment.
Figure 5:
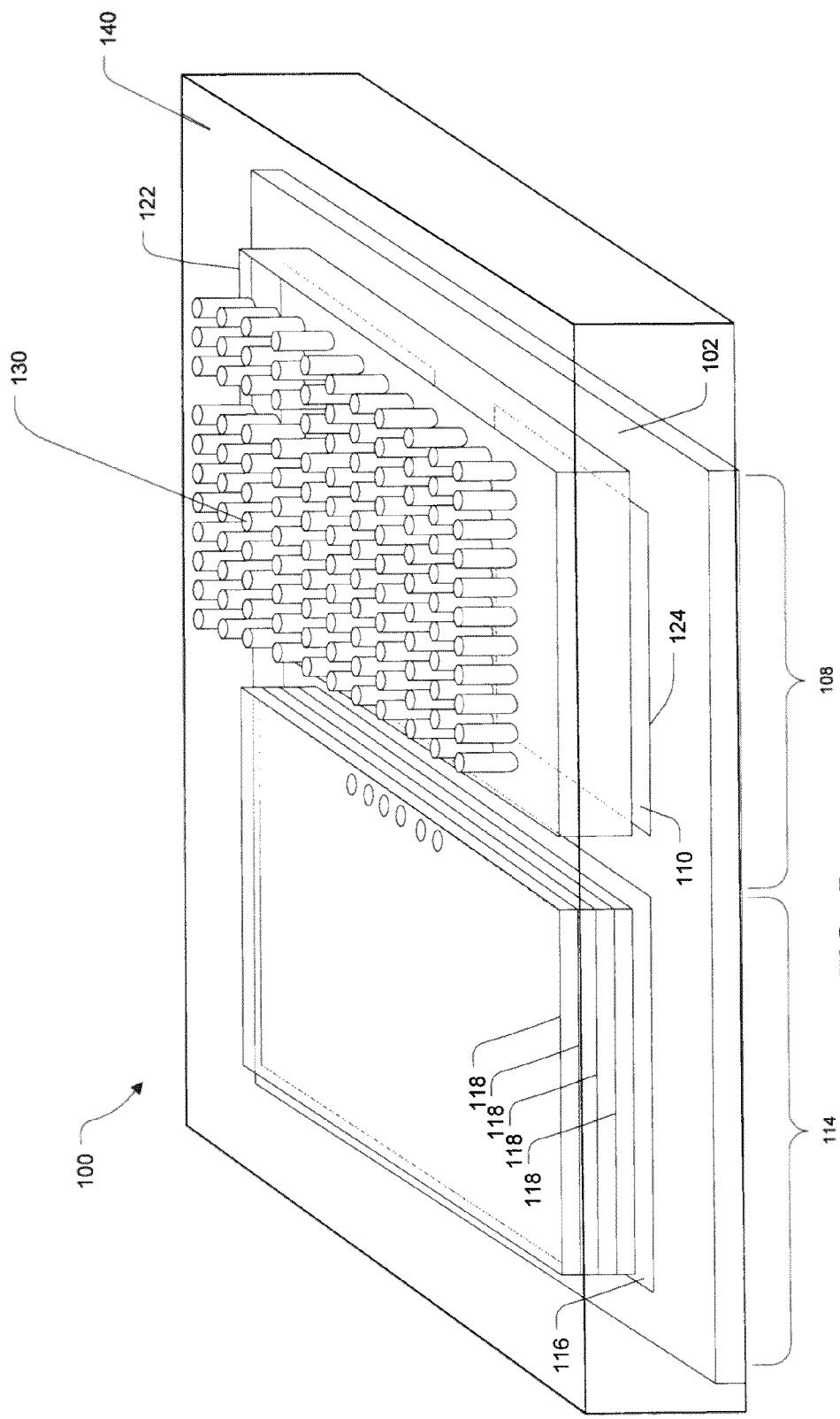
FIG. 5 is a perspective view of the stacking arrangement of FIG. 4.
Figure 6:
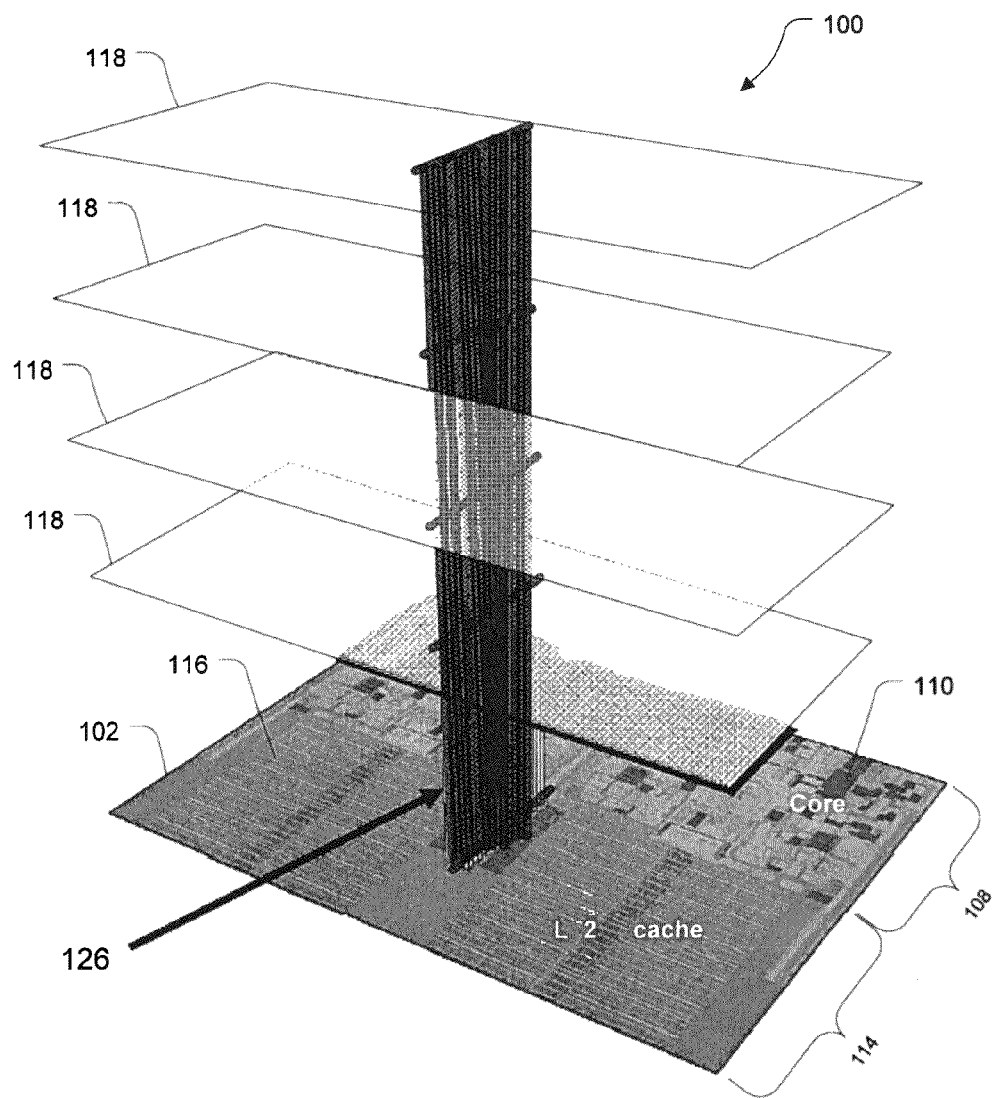
FIG. 6 is an exploded view of the stacking arrangement of FIG. 4.

A layer of bulk material 122, such as bulk silicon, is disposed on the processor region 108 of the chip 102. The bulk material 122 acts as a spacer to create a more uniformly-shaped package, and may also serve other functions. The thermal conductivity of the bulk material 122 may improve dissipation of the heat generated by the core processors 110 during their operation, and a heat sink 130 (FIG. 5) may be disposed on the top surface of the bulk material 122 after a packaging compound 140 has been applied to the entire assembly, to further enhance its heat dissipation properties. If the top surface of the bulk material 122 is approximately coplanar with the top surface of the stack of DRAM chips 118 (as shown in FIG. 4), the heat sink 130 may also be disposed on the top surface of the stack of DRAM chips 118.

In this configurations, the CPU chip 102 may communicate with each of the DRAM chips 118 using through-silicon vias (TSVs) 126 (shown in FIG. 6) extending from the non-core region 114 of the CPU chip 102 that is positioned directly below the DRAM chips 118, resulting in a short signal path that allows rapid communication between the DRAM chips 118 and the SRAM cache 116. The CPU chip 102 communicates with external devices via the ball grid array 106. In this arrangement, both the core processors 110 and the DRAM chips 118 may be directly cooled via a thermal path to a heat sink without passing through the other. Although this arrangement results in a reduced area for each DRAM chip 118, the improved thermal isolation of the DRAM chips 118 from the core processors 110 enables more DRAM chips 118 to be stacked. As a result, storage capacity may be maintained or increased while maintaining an acceptable operating temperature, which in turn results in improved performance and reliability of the DRAM chips 118.

Figure 2:
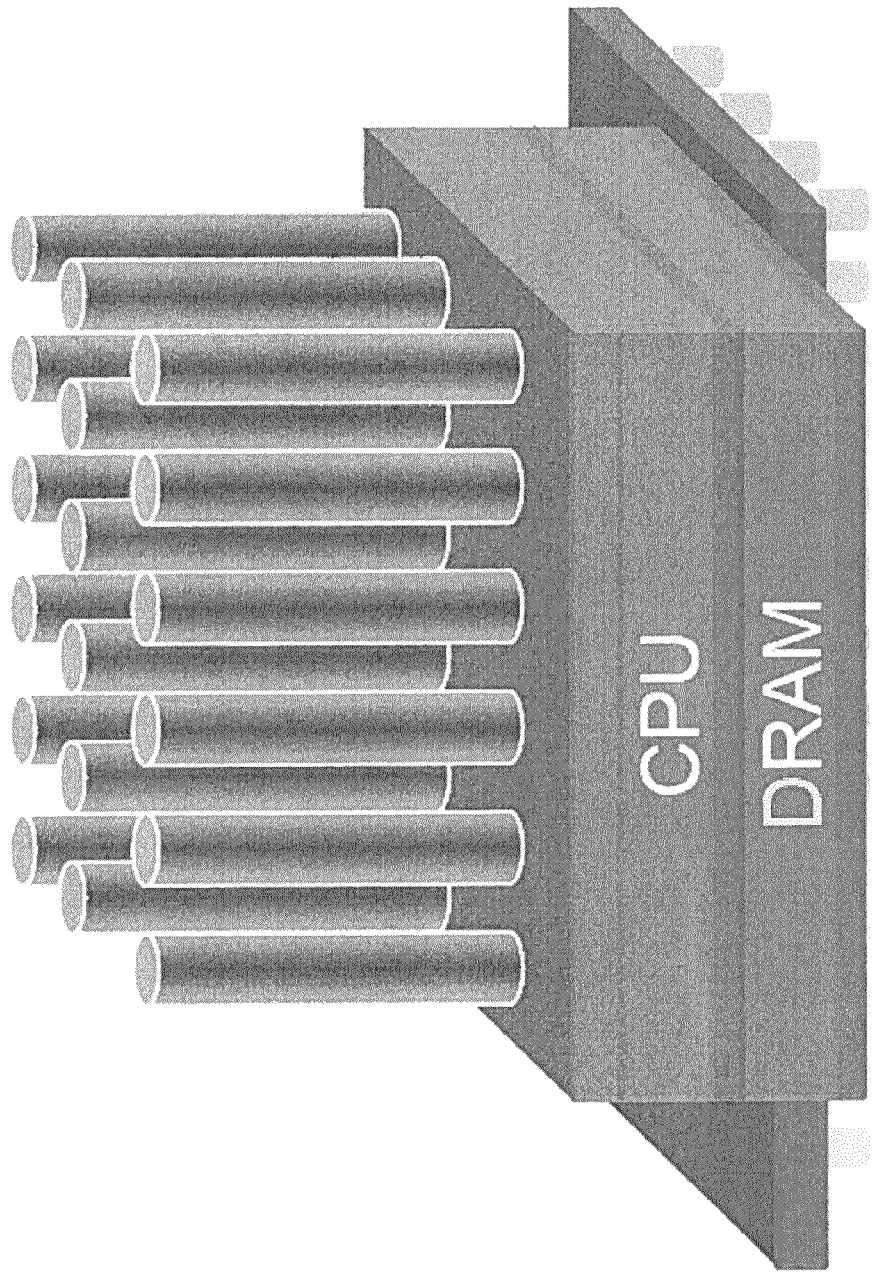
FIG. 2 is a schematic diagram of a CPU-over-memory stacking arrangement according to a prior art embodiment.
Figure 3:
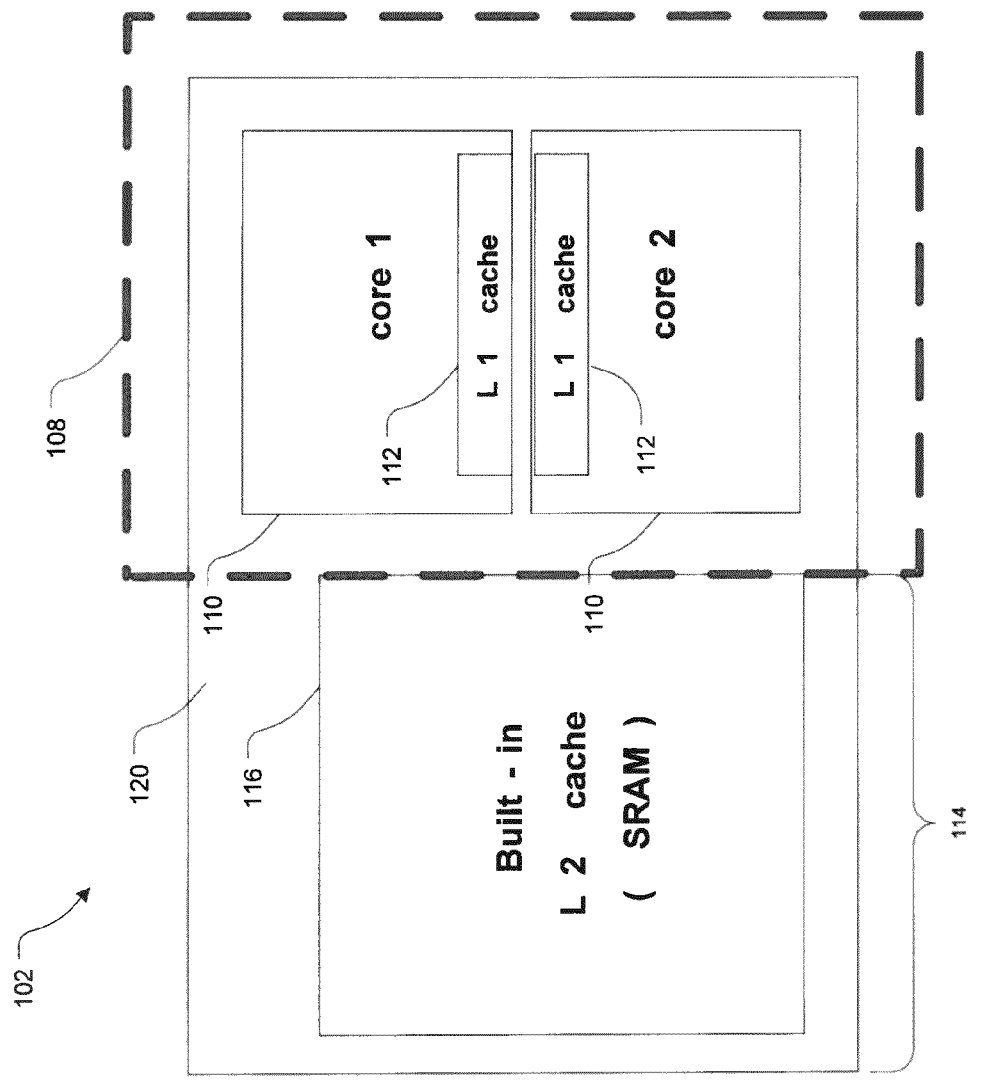
FIG. 3 is a schematic diagram of a CPU chip according to an embodiment.
Figure 7:
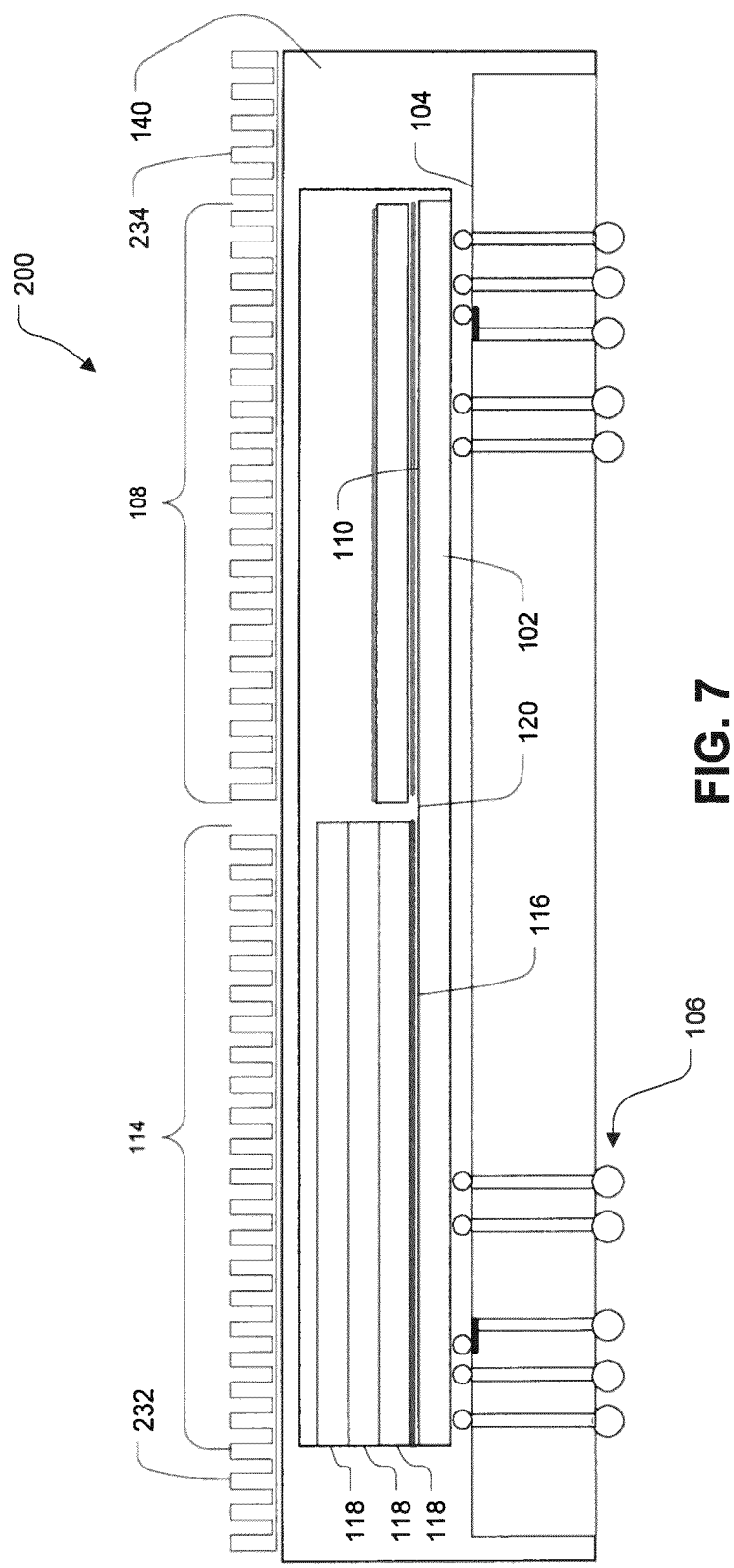
FIG. 7 is a schematic side elevation view of a memory-over-CPU stacking arrangement according to a second embodiment.

Referring now to FIG. 7, the MCP 200 according to a second embodiment is similar to the MCP 100 of FIG. 3, except that the bulk material 122 has been omitted. Corresponding parts have been given corresponding reference numerals and will not be described again in detail. In this configuration, separate heat sinks 232, 234 may optionally be placed directly on the top surface 124 of the processor region 108 and the top DRAM chip 118, thereby providing improved cooling of both the core processors 110 and the DRAM chips 118 relative to the configurations of FIGS. 1 and 2.

Figure 8:
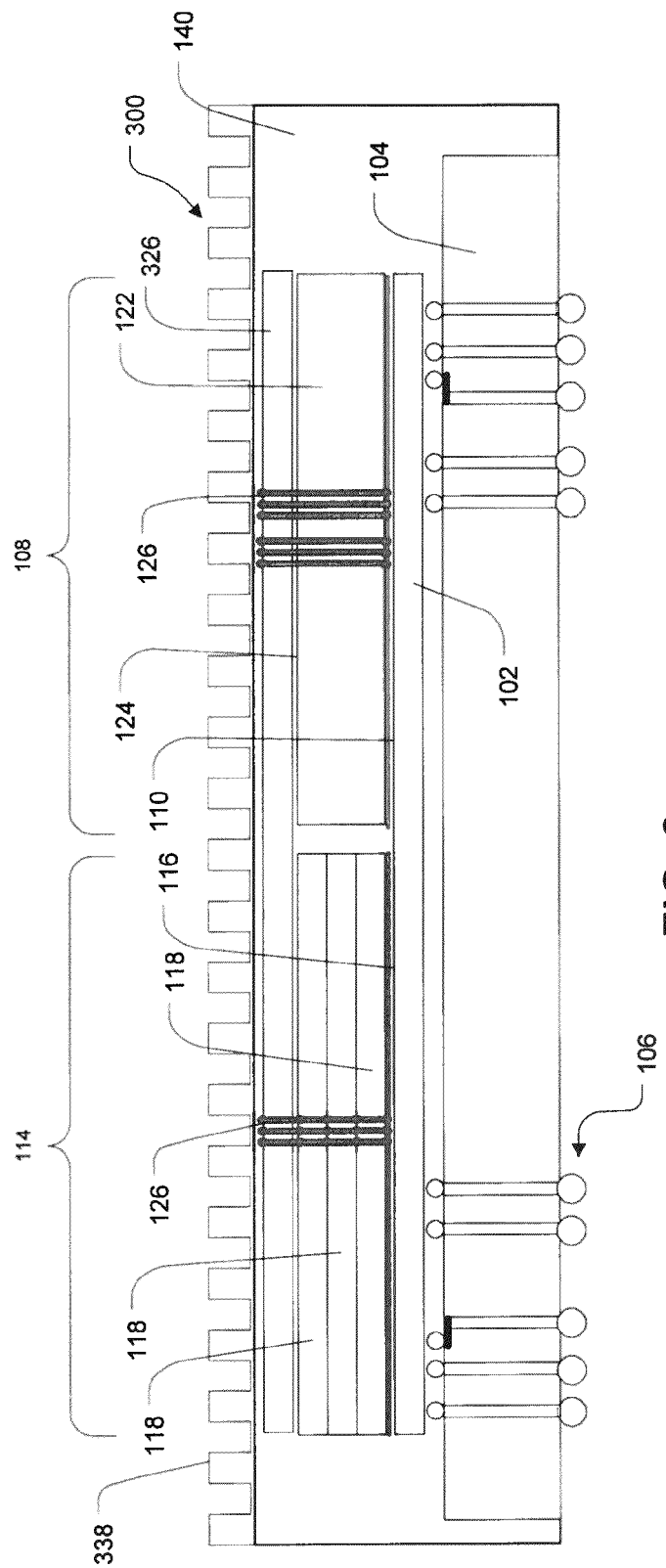
FIG. 8 is a schematic side elevation view of a memory-over-CPU stacking arrangement according to a third embodiment.

Referring now to FIG. 8, the MCP 300 according to a third embodiment is similar to the MCP 100 of FIG. 3. Corresponding parts have been given corresponding reference numerals and will not be described again in detail. The layer of bulk material 122 is approximately equal in height to the stack of DRAM chips 118, to facilitate packaging of the MCP 300. An additional chip 326, which may be a chip with relatively low thermal sensitivity and relatively low heat generation such as a MEMS or random logic based chip, is stacked on top of the DRAM chips 118 and the bulk material 122. The CPU chip 102 may communicate with the chip 326 via TSVs 126 passing through the bulk material 122, to minimize the TSV overhead of the DRAM chips 118. It is contemplated that multiple chips or other components such as a common heat sink 338 might additionally or alternatively be stacked on top of the DRAM chips 118 and the bulk material 122.

Figure 9:
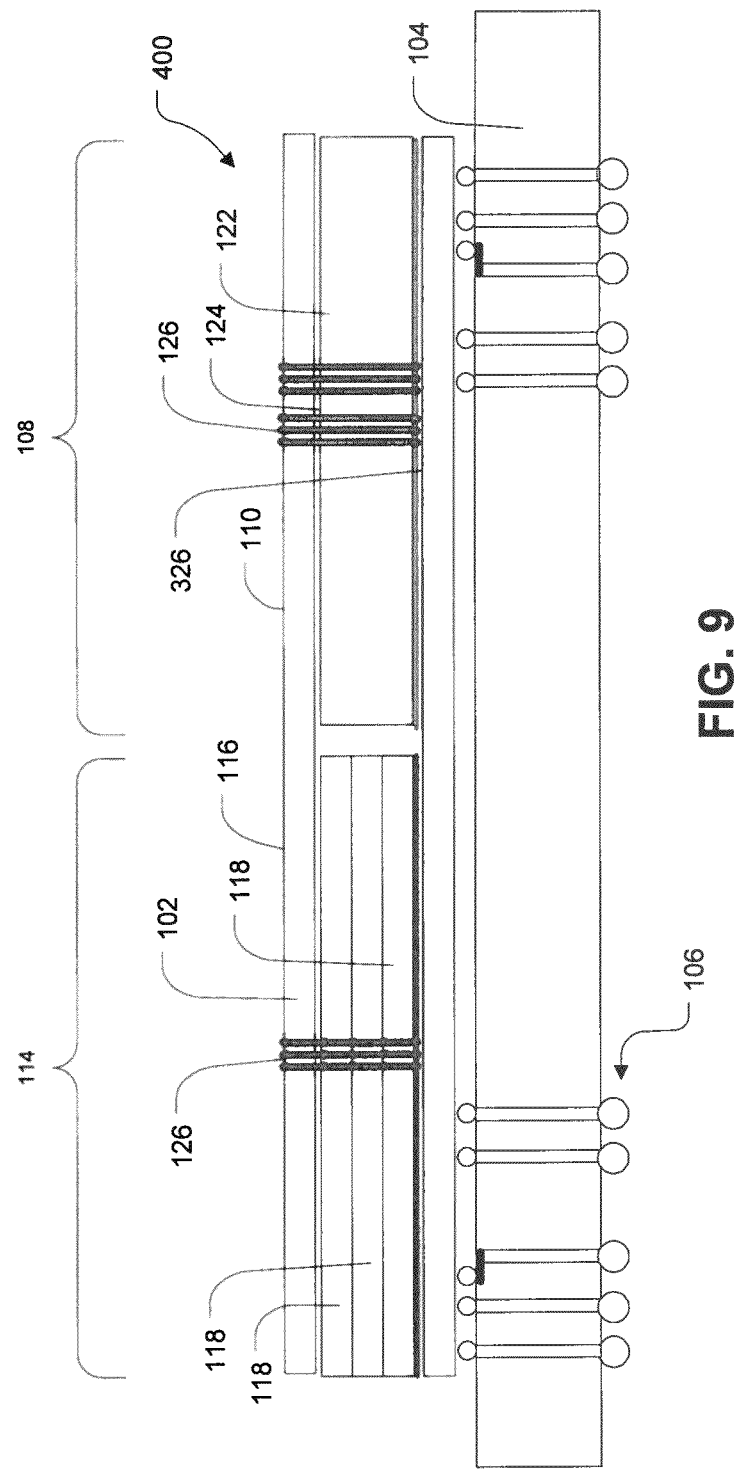
FIG. 9 is a schematic side elevation view of a CPU-over-memory stacking arrangement according to a fourth embodiment.

Referring now to FIG. 9, the MCP 400 according to a fourth embodiment is similar to the MCP 100 of FIG. 3. Corresponding parts have been given corresponding reference numerals and will not be described again in detail. In this embodiment, the chip 326 is mounted closest to the substrate 104. It is contemplated that multiple chips 326 may be used. The DRAM chips 118 are stacked on top of a portion of the chip 326, and the bulk material 122 is stacked on the remaining area of the chip 326. The CPU chip 102 is mounted on top of the DRAM chips 118 and the bulk material 122 such that the non-core region 114 of the CPU chip 102 substantially overlaps the DRAM chips 118 and the processor region 108. It is contemplated that additional core processors 110 may be stacked above or below the processor region 108 of the CPU chip 102. If the additional core processors 110 are stacked below the processor region 108, the thickness of the bulk material 122 may be reduced accordingly. The CPU chip 102 may communicate with the substrate using TSVs 126 through the bulk material, thereby reducing the TSV overhead of the DRAM chips 118. A heat sink may optionally be mounted on the CPU chip 102 to provide cooling for both the core processors 110 and the DRAM chips 118.

Modifications and improvements to the above-described embodiments of the present invention may become apparent to those skilled in the art. The foregoing description is intended to be by way of example rather than limiting. The scope of the present invention is therefore intended to be limited solely by the scope of the appended claims.

The invention claimed is:

1. A multi-chip package comprising:
   a substrate having electrical contacts for connection to an external device;
   a CPU die disposed on the substrate and being in communication with the substrate; the CPU die comprising:
      a plurality of processor cores occupying a first area of the CPU die; and
      an SRAM cache occupying a second area of the CPU die; and
   a DRAM cache disposed on the CPU die and being in communication with the CPU die,
   the DRAM cache comprising a plurality of stacked DRAM dies,
   the plurality of stacked DRAM dies being substantially aligned with the second area of the CPU die; and
   the plurality of stacked DRAM dies substantially not overlapping the first area of the CPU die.

2. The multi-chip package of claim 1, further comprising:
   a bulk material disposed on the CPU die and being substantially aligned with the first area of the CPU die.

3. The multi-chip package of claim 2, wherein:
   the bulk material has a top surface substantially coplanar to a top surface of the plurality of stacked DRAM dies.

4. The multi-chip package of claim 3, further comprising a heat sink disposed on the top surface of the bulk material and on the top surface of the plurality of stacked DRAM dies.

5. The multi-chip package of claim 2, further comprising a heat sink disposed on a top surface of the bulk material.

6. The multi-chip package of claim 3, further comprising:
   a chip disposed on the top surface of the bulk material and on the top surface of the plurality of stacked DRAM dies, the chip being in communication with the CPU die.

7. The multi-chip package of claim 6, wherein:
   the chip and the plurality of DRAM dies are in communication with the CPU die via through-silicon vias (TSVs).

8. The multi-chip package of claim 7, wherein at least some of the TSVs pass through the bulk material.

9. The multi-chip package of claim 1, further comprising a heat sink disposed on a top surface of the plurality of stacked DRAM dies.

10. The multi-chip package of claim 1, further comprising a heat sink disposed on a top surface of the first area of the CPU die.

11. The multi-chip package of claim 1, further comprising at least one die disposed on the CPU die and being substantially aligned with the first area of the CPU die, the at least one die comprising at least one additional processor core.

12. A multi-chip package comprising:
a substrate having electrical contacts for connection to an external device;
a DRAM cache disposed on the substrate and being in communication with a CPU die, the DRAM cache comprising a plurality of stacked DRAM dies;
a bulk material disposed on the substrate; and
the CPU die being disposed on the DRAM cache and the substrate, the CPU die being in communication with the substrate; the CPU die comprising:
 a plurality of processor cores occupying a first area of the CPU die; and
 an SRAM cache occupying a second area of the CPU die,
the plurality of stacked DRAM dies being substantially aligned with the second area of the CPU die; and
the bulk material being substantially aligned with the first area of the CPU die.

13. The multi-chip package of claim 12, wherein:
the bulk material has a top surface substantially coplanar to a top surface of the plurality of stacked DRAM dies.

14. The multi-chip package of claim 12, wherein:
the substrate and the plurality of DRAM dies are in communication with the CPU die via through-silicon vias (TSVs).

15. The multi-chip package of claim 14, wherein at least some of the TSVs pass through the bulk material.

16. The multi-chip package of claim 12, further comprising a heat sink disposed on a top surface of the CPU die.

17. The multi-chip package of claim 12, further comprising at least one die disposed on a top surface of the bulk material and being substantially aligned with the first area of the CPU die, the at least one die comprising at least one additional processor core.

\* \* \* \* \*